United States Patent
Kawasaki et al.

(10) Patent No.: US 10,811,376 B2
(45) Date of Patent: Oct. 20, 2020

(54) CU COLUMN, CU CORE COLUMN, SOLDER JOINT, AND THROUGH-SILICON VIA

(71) Applicant: Senju Metal Industry Co., Ltd., Tokyo (JP)

(72) Inventors: Hiroyoshi Kawasaki, Tochigi (JP); Takahiro Roppongi, Tochigi (JP); Daisuke Soma, Tochigi (JP); Isamu Sato, Saitama (JP); Yuji Kawamata, Tochigi (JP)

(73) Assignee: Senju Metal Industry Co., Ltd., Tokyo (JP)

( * ) Notice: Subject to any disclaimer, the term of this patent is extended or adjusted under 35 U.S.C. 154(b) by 0 days.

(21) Appl. No.: 15/509,333

(22) PCT Filed: Sep. 9, 2014

(86) PCT No.: PCT/JP2014/073808
§ 371 (c)(1),
(2) Date: Mar. 7, 2017

(87) PCT Pub. No.: WO2016/038686
PCT Pub. Date: Mar. 17, 2016

(65) Prior Publication Data
US 2017/0287862 A1    Oct. 5, 2017

(51) Int. Cl.
*B23K 35/00* (2006.01)
*H01L 23/00* (2006.01)
(Continued)

(52) U.S. Cl.
CPC ........... *H01L 24/13* (2013.01); *B22F 1/00* (2013.01); *B23K 35/0227* (2013.01);
(Continued)

(58) Field of Classification Search
CPC .............. B23K 35/302; B23K 35/0222; B23K 35/0244
(Continued)

(56) References Cited

U.S. PATENT DOCUMENTS 4,705,205 A * 11/1987 Allen ................. B23K 3/06
228/180.22
5,591,941 A *  1/1997 Acocella ........... B23K 1/0008
174/266
(Continued)

FOREIGN PATENT DOCUMENTS

CN       103415633 A    11/2013
EP        3103565 A1    12/2016
(Continued)

OTHER PUBLICATIONS

JP-2007115857-A computer english translation (Year: 2007).*

*Primary Examiner* — Erin B Saad
(74) *Attorney, Agent, or Firm* — The Webb Law Firm (57) ABSTRACT

Provided are a Cu column, a Cu core column, a solder joint, and a through-silicon via, which have the low Vickers hardness and the small arithmetic mean roughness. For the Cu column 1 according to the present invention, its purity is equal to or higher than 99.9% and equal to or lower than 99.995%, its arithmetic mean roughness is equal to or less than 0.3 μm, and its Vickers hardness is equal to or higher than 20 HV and equal to or less than 60 HV. Since the Cu column 1 is not melted at a melting temperature in the soldering and a definite stand-off height (a space between the substrates) can be maintained, it is preferably applied to the three dimensional mounting or the pitch narrowing mounting.

19 Claims, 2 Drawing Sheets

(51) Int. Cl.
  *H01L 23/522* (2006.01)
  *B22F 1/00* (2006.01)
  *H01L 23/50* (2006.01)
  *B23K 35/26* (2006.01)
  *C22C 13/00* (2006.01)
  *C25D 5/12* (2006.01)
  *C22C 9/00* (2006.01)
  *C25D 7/00* (2006.01)
  *C25D 5/10* (2006.01)
  *B23K 35/30* (2006.01)
  *B23K 35/02* (2006.01)
  *B23K 35/36* (2006.01)
  *B32B 15/01* (2006.01)
  *B32B 15/20* (2006.01)
  *H01L 23/48* (2006.01)
  *H05K 3/40* (2006.01)
  *H01B 1/02* (2006.01)
  *H01L 21/288* (2006.01)
  *H01L 21/768* (2006.01)

(52) U.S. Cl.
  CPC ........... *B23K 35/26* (2013.01); *B23K 35/262* (2013.01); *B23K 35/30* (2013.01); *B23K 35/302* (2013.01); *B23K 35/3615* (2013.01); *B32B 15/01* (2013.01); *B32B 15/20* (2013.01); *C22C 9/00* (2013.01); *C22C 13/00* (2013.01); *C25D 5/10* (2013.01); *C25D 5/12* (2013.01); *C25D 7/00* (2013.01); *H01L 23/481* (2013.01); *H01L 23/50* (2013.01); *H01L 23/522* (2013.01); *B32B 2255/06* (2013.01); *B32B 2255/205* (2013.01); *H01B 1/026* (2013.01); *H01L 21/2885* (2013.01); *H01L 21/76885* (2013.01); *H01L 24/11* (2013.01); *H01L 2224/11825* (2013.01); *H01L 2224/13005* (2013.01); *H01L 2224/1357* (2013.01); *H01L 2224/1358* (2013.01); *H01L 2224/1366* (2013.01); *H01L 2224/1369* (2013.01); *H01L 2224/13147* (2013.01); *H01L 2224/13582* (2013.01); *H01L 2224/13655* (2013.01); *H01L 2224/13657* (2013.01); *H01L 2924/0002* (2013.01); *H01L 2924/0103* (2013.01); *H01L 2924/0105* (2013.01); *H01L 2924/0109* (2013.01); *H01L 2924/01015* (2013.01); *H01L 2924/01016* (2013.01); *H01L 2924/01026* (2013.01); *H01L 2924/01027* (2013.01); *H01L 2924/01028* (2013.01); *H01L 2924/01033* (2013.01); *H01L 2924/01047* (2013.01); *H01L 2924/01048* (2013.01); *H01L 2924/01049* (2013.01); *H01L 2924/01051* (2013.01); *H01L 2924/01079* (2013.01); *H01L 2924/01082* (2013.01); *H01L 2924/01083* (2013.01); *H01L 2924/01092* (2013.01); *H01L 2924/35* (2013.01); *H05K 3/4015* (2013.01); *H05K 2201/10242* (2013.01)

(58) Field of Classification Search
  USPC .................................................. 228/203, 246
  See application file for complete search history.

(56) References Cited

U.S. PATENT DOCUMENTS

| | | | | |
|---|---|---|---|---|
| 7,036,710 | B1* | 5/2006 | Bartley | ............... B23K 9/285 228/180.22 |
| 2007/0001315 | A1* | 1/2007 | Yokoyama | ........ H01L 23/49866 257/779 |
| 2008/0164300 | A1* | 7/2008 | Alcoe | ............... B23K 3/0623 228/180.22 |
| 2013/0025917 | A1* | 1/2013 | Chiba | ..................... B21J 15/02 174/257 |
| 2014/0010705 | A1 | 1/2014 | Kanou | |
| 2015/0196978 | A1* | 7/2015 | Iseki | ..................... B23K 35/262 174/260 |
| 2015/0209912 | A1 | 7/2015 | Kawasaki et al. | |
| 2015/0217408 | A1 | 8/2015 | Kawasaki et al. | |
| 2015/0313025 | A1* | 10/2015 | Kawasaki | ................. B22F 1/02 403/272 |
| 2017/0246711 | A1 | 8/2017 | Kawasaki et al. | |

FOREIGN PATENT DOCUMENTS

| | | | | |
|---|---|---|---|---|
| JP | 766209 | A | | 3/1995 |
| JP | 2000232119 | A | | 8/2000 |
| JP | 2000260933 | A | | 9/2000 |
| JP | 3344295 | B2 | | 8/2002 |
| JP | 2003249598 | A | | 9/2003 |
| JP | 2007115857 | A | * | 5/2007 |
| JP | 2007115857 | A | | 5/2007 |
| JP | 20091474 | A | | 1/2009 |
| JP | 4404063 | B2 | | 11/2009 |
| JP | 2011176124 | A | | 9/2011 |
| JP | 2011206815 | A | | 10/2011 |
| JP | 5534122 | B1 | | 6/2014 |
| JP | 5576004 | B1 | | 8/2014 |
| JP | 5585751 | B1 | | 8/2014 |
| JP | 5590259 | B1 | | 8/2014 |
| JP | 201818985 | A | | 2/2018 |
| WO | WO-2014087514 | A1 | * | 6/2014 ............... B22F 1/02 |

* cited by examiner

CU COLUMN, CU CORE COLUMN, SOLDER JOINT, AND THROUGH-SILICON VIA

CROSS-REFERENCE TO RELATED APPLICATION

This application is the United States national phase of International Application No. PCT/JP2014/073808 filed Sep. 9, 2014, the disclosure of which is hereby incorporated in its entirety by reference.

TECHNICAL FIELD

The present invention relates to a Cu column, a Cu core column, a solder joint, and a through-silicon via.

BACKGROUND

Recently, along with development of compact information equipment, electronic components to be mounted have been downsized rapidly. A ball grid alley (hereinafter referred to as "BGA") having electrodes at its rear surface is applied to such electronic components in order to cope with a narrowed connection terminal and a reduced mounting area because of the downsizing requirement.

As the electronic components to which the BGA is applied, for example, a semiconductor package is exemplified. In the semiconductor package, a semiconductor chip having electrodes is sealed with resin. A solder bump is formed on each of the electrodes of the semiconductor chip. This solder bump is formed by joining a solder ball to each electrode of the semiconductor chip. The semiconductor package to which the BGA is applied is mounted on a printed circuit board by joining the solder bump melted by the heating to a conductive land of the printed circuit board. Additionally, a three-dimensional high-density mounting has been developed by stacking up the semiconductor packages in a height direction in order to meet the further high-density mounting requirement.

However, in a case that the BGA is applied to the semiconductor package for the three-dimensional high-density mounting, the solder ball may be crushed by semiconductor package's weight. If such an accident happens, an appropriate space between the substrates cannot be maintained.

Accordingly, a solder bump has been considered, where a Cu ball is electrically joined on an electrode of an electronic component by using solder paste. The solder bump formed by using the Cu ball can support a semiconductor package by the Cu ball, which is not melted at a melting temperature of the solder, even if the solder bump receives the weight of the semiconductor package when the electronic components are mounted on the printed circuit board. Therefore, the solder bump is not crushed by the semiconductor package's weight.

However, when the above-mentioned Cu ball is used, there have been problems as below. In case of a Cu ball, since a stand-off height between the substrates determines a diameter of the Cu ball, an attempt to create a required stand-off height makes a width of the Cu ball broader, so that an occasion may occur when it couldn't correspond to a pitch narrowing mounting. Moreover, generally, in a semiconductor package, a semiconductor chip is joined to a die pad electrode of a lead frame by using a solder material for die-bonding, and then it is sealed with resin. In a case that this semiconductor package is mounted on the printed circuit board, a solder material for the mounting, which differs from a solder material for the die-bonding, is used. This is because of preventing the solder material for die-bonding from melting out by heat conditions of the solder material for the mounting when mounting the semiconductor package on the printed circuit board. As just described, in a case that different materials are used as the solder material for die-bonding and a solder material for the mounting, a difference arises in coefficient of thermal expansion of each of the substrates. Therefore, stress (heat stress) is generated at a joining part with a solder bump by the changes of environmental temperature and the like, and consequently an occasion may occur when the reliability of the TCT (Temperature Cycling Test) becomes low.

Accordingly, in recent years, a Cu column which is more applicable to pitch narrowing than a solder ball and allows the improvement of the reliability of the TCT to be expected has been developed. Additionally, in case of comparing a Cu ball to a Cu column, both of which have an identical pitch, a column shape is more stable than a ball shape in supporting the electrode. On this point, the utilization of the Cu column has been considered. For example, Patent Documents 1 through 5 disclose pillar-shaped columns including Cu, solder or the like. Patent Document 6 discloses a Cu column which joints a ceramic substrate with a glass epoxy board, where the Vickers hardness is equal to or less than 55 HV.

PRIOR ART DOCUMENTS

Patent Documents

Patent Document 1: Japanese Patent Application Publication No.H07-66209
Patent Document 2: Japanese Patent No.3344295
Patent Document 3: Japanese Patent Application Publication No.2000-232119
Patent Document 4: Japanese Patent No.4404063
Patent Document 5: Japanese Patent Application Publication No.2009-1474
Patent Document 6: Japanese Patent Application Publication No.2011-176124

SUMMARY OF THE INVENTION

Problems to be Solved by the Invention

However, although the above-mentioned Patent Documents 1 through 6 can correspond to the pitch narrowing mounting and inhibit the heat stress, they do not disclose any arithmetic mean roughness of a Cu column at all. Therefore, in the case of using the Cu columns of Patent Documents 1 through 6, there are some occasions of causing problems such as low fluidity of each Cu column in setting the Cu columns in array on the substrate, or low adhesion between the Cu column and the electrode in mounting.

Accordingly, in order to solve the above-described problems, the present invention has an object to provide a Cu column, a Cu core column, a solder joint, and a through-silicon via, which have the low Vickers hardness and the small arithmetic mean roughness.

Means for Solving the Problems

The inventors of the present invention have conducted a selection of the Cu column. They have found out that the Cu column and the like, which is preferable for the solution of problems in the present invention, could be obtained when the Vickers hardness of the Cu column is equal to or higher than 20 HV and equal to or less than 60 HV, and the arithmetic mean roughness thereof is equal to or less than 0.3 μm.

Here, the present invention will be described as follows.

(1) A Cu column containing:
purity which is equal to or higher than 99.9% and equal to or lower than 99.995%,
arithmetic mean roughness which is equal to or less than 0.3 μm, and
Vickers hardness which is equal to or higher than 20 HV and equal to or less than 60 HV.

(2) The Cu column according to the above-mentioned item (1), wherein an alpha dose is equal to or less than 0.0200 cph/cm$^2$.

(3) The Cu column according to the above-mentioned item (1) or (2), wherein said Cu column is composed of a column which has a diameter of the top surface of 1-1000 μm, a diameter of the bottom surface of 1-1000 μm, and a height of 1-3000 μm.

(4) The Cu column according to any one of the above-mentioned items (1) through (3) wherein the Cu column is coated with a flux layer.

(5) The Cu column according to any one of the above-mentioned items (1) through (3) wherein the Cu column is coated with an organic film containing an imidazole compound.

(6) A Cu core column, containing:
the Cu column according to any one of the above-mentioned items (1) through (4); and
a solder layer which coats the Cu column.

(7) A Cu core column containing:
the Cu column according to any one of the above-mentioned items (1) through (4); and
a plating layer which includes at least one element selected from a group of Ni, Fe and Co, the plating layer coating the Cu column.

(8) The Cu core column according to the above-mentioned item (7), further comprising:
a solder layer which coats the plating layer.

(9) The Cu core column according to any one of the above-mentioned items (6) through (8) wherein an alpha dose is equal to or less than 0.0200 cph/cm$^2$.

(10) The Cu core column according to any one of the above-mentioned items (6) through (9) wherein the Cu core column is coated with a flux layer.

(11) A solder joint using the Cu column according to any one of the above-mentioned items (1) through (5).

(12) A through-silicon via using the Cu column according to any one of the above-mentioned items (1) through (5).

(13) A solder joint using the Cu core column according to any one of the above-mentioned items (6) through (10).

(14) A through-silicon via using the Cu core column according to any one of the above-mentioned items (6) through (10).

Effects of the Invention

According to the present invention, since the Vickers hardness of the Cu column is equal to or higher than 20 HV and equal to or less than 60 HV, the impact resistance to dropping can be improved, as well as an appropriate space between the substrates can be maintained. Additionally, since the arithmetic mean roughness of the Cu column is equal to or less than 0.3 μm, the fluidity of each Cu column in setting the Cu columns in array on the substrate can be improved, as well as the adhesion between the Cu column and the electrode in mounting can be improved.

EMBODIMENTS FOR CARRYING OUT THE INVENTION

The present invention will be described in detail hereinafter. In this specification, units (such as ppm, ppb and %) relating to composition of the Cu column represent ratios to mass of the Cu column (mass ppm, mass ppb and mass %) unless otherwise specified.

Figure 1:
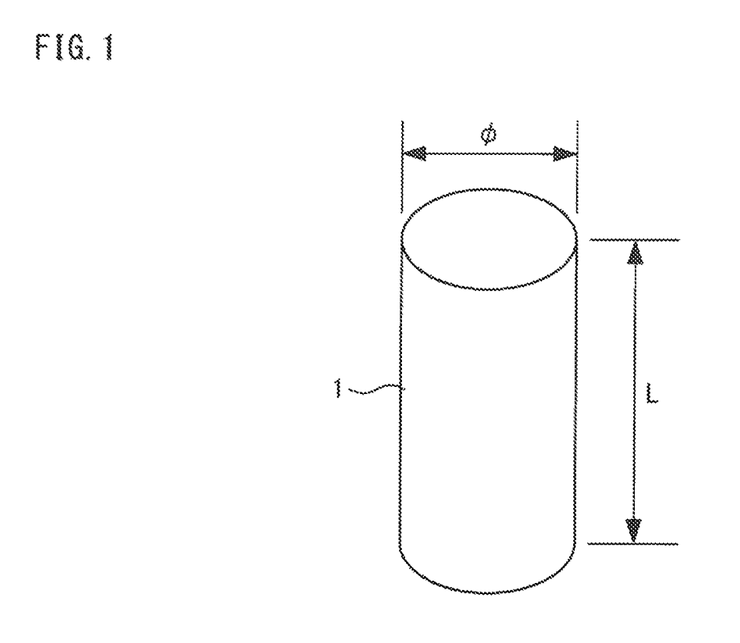
FIG. 1 is a diagram of a Cu column according to the prevent invention for illustrating a configuration example thereof.

The Cu column 1, shown in FIG. 1, according to the present invention contains purity which is equal to or higher than 99.9% and equal to or lower than 99.995%, arithmetic mean roughness which is equal to or less than 0.3 μm, and Vickers hardness which is equal to or higher than 20 HV and equal to or less than 60 HV. The Cu column 1 is composed of cylinder column form, for example. Since the Cu column 1 is not melted at a melting temperature in the soldering and a definite stand-off height (a space between the substrates) can be maintained, it can be preferably applied to the three dimensional mounting or the pitch narrowing mounting.

<Arithmetic Mean Roughness of Cu Column: Equal to or Less than 0.3 μm>

Arithmetic mean roughness of the Cu column 1 is equal to or less than 0.3 μm, and more preferably equal to or less than 0.2 μm. In a case where the arithmetic mean roughness of the Cu column 1 is equal to or less than 0.3 μm, the size of a crystal grain of the Cu column 1 becomes smaller, and therefore a surface of the Cu column 1 can be smoother (flatter). Thereby, the fluidity of each of the Cu columns 1 can be improved when setting the Cu columns 1 in array on the substrate by a mounter and the like, and simultaneously the adhesion between the Cu column 1 and the electrode on the substrate in the mounting can be improved.

<The Vickers Hardness: Equal to or Higher than 20 HV and Equal to or Less than 60 HV>

The Vickers hardness of the Cu column 1 according to the present invention is preferably equal to or less than 60 HV. This is because the durability against external stress becomes high, the impact resistance to dropping is improved, and cracks are difficult to generate, in a case that the Vickers hardness is equal to or less than 60 HV. This is also because, in a case that the auxiliary force such as pressurization is applied when forming three-dimensional mounting bumps and joints, a possibility that a crash of electrode and the like may occur can be lowered with the use of the Cu column 1 which is superior in flexibility.

In addition, the Vickers hardness of the Cu column 1 according to the present invention needs to be at least the value higher than 10-20 HV which is a typical value of the Vickers hardness of solder, and is preferably equal to or higher than 20 HV. In a case that the Vickers hardness of the Cu column 1 is equal to or higher than 20 HV, any deformation (crash) of the Cu column 1, which is caused by its own weight of the semiconductor chips or the like in the three-dimensional mounting, can be prevented, and an appropriate space between the substrates (stand-off height) can be maintained. Additionally, because no plating step is required like Cu pillar and the like, a pitch narrowing for the electrode or the like can be realized by setting the Vickers hardness of the Cu column 1 at 20 HV and more.

In the present embodiment, after manufacturing the Cu column 1, the crystal growth of the manufactured Cu column 1 is expedited, and therefore the Cu column 1 whose Vickers hardness is equal to or less than 60 HV is manufactured. As a means for expediting the crystal growth of the Cu column 1, an annealing treatment is exemplified, for example. When the annealing treatment is performed on the Cu column 1 after manufacturing, Cu structure is recrystallized and a crystal grain grows bigger, and thereby a flexibility of the Cu column 1 is improved. Meanwhile, in a case of using a Cu column 1 having a fixed amount of impurities, for example, 3N, 4N, 4N5 in purity, the contained impurities inhibit excess growth of the crystal grain on the surface of the Cu column 1, so that the size of the crystal grain is limited to a size of a definite value or less. Accordingly, a Cu column can be provided with, where both requirements of low Vickers hardness and low arithmetic mean roughness are met.

<U: Equal to or Less than 5 ppb, and Th: Equal to or Less than 5 ppb>

U and Th are radioactive elements and it is required to reduce the content of these elements in order to suppress a soft error. The contents of respective U and Th should be equal to or less than 5 ppb in order to make an alpha dose of the Cu column 1 equal to or less than 0.0200 cph/cm². In addition, from a viewpoint of the suppression of the soft error for the current or future high-density mounting, the contents of respective U and Th should be equal to or less than 2 ppb.

<Purity in Cu Column: Equal to or Higher than 99.9% and Equal to or Lower than 99.995%>

It is preferable that purity in the Cu column 1 constituting the present invention is equal to or higher than 99.9% and equal to or lower than 99.995%.

If the purity in the Cu column 1 is within this range, a sufficient volume of crystal cores of the impurity elements can be kept in Cu, and therefore the arithmetic mean roughness of Cu column 1 can be lessened. Whereas, if the number of impurity elements is less, then the relatively less crystal cores are formed. This causes the grain to grow up in a directional property without suppressing the growth thereof. Therefore, the arithmetic mean roughness of Cu column 1 becomes increased. Although a lower limit value of the purity of the Cu column 1 is not limited: It is preferably equal to or higher than 99.9% from the viewpoints such that the alpha dose is suppressed and the degradation of the electrical conductivity and thermal conductivity of the Cu column 1 based on the reduced purity is suppressed. Sn, Sb, Bi, Zn, As, Ag, Cd, Ni, Pb, Au, P, S, In, Co, Fe, U, Th, etc. are enumerated as the impurity elements.

<Alpha Dose: Equal to or Less than 0.0200 cph/cm²

The alpha dose of the Cu column 1 constituting the present invention is equal to or less than 0.0200 cph/cm². This is alpha dose such that it is insignificant for any soft errors in the high-density mounting of the electronic components. The alpha dose is more preferably equal to or less than 0.0010 cph/cm² from the viewpoints of suppressing the soft error in the further high-density mounting.

<Total Content of Impurity Elements: Equal to or More than 1 ppm>

The Cu column 1 constituting the present invention contains Sn, Sb, Bi, Zn, As, Ag, Cd, Ni, Pb, Au, P, S, In, Co, Fe, U, Th, etc. as impurity elements. The total content of impurity elements, however, is equal to or more than 1 ppm. Moreover, the content of Pb and Bi, both of which are impurity elements, is preferably as small as possible.

<Diameters of Top and Bottom Surfaces of Cu Column: 1-1000 μm, Height of Cu Column: 1-3000 μm>

A diameter φ of each of the top and bottom surfaces of the Cu column 1 according to the present invention is preferably 1-1000 μm, and especially in case of an use of fine pitching, more preferably 1-300 μm, far more preferably 1-200 μm, and most preferably 1-100 μm. Also, a height L of the Cu column 1 is preferably 1-3000 μm, and especially in case of an use of fine pitching, more preferably 1-300 μm, far more preferably 1-200 μm, and most preferably 1-100 μm (See FIG. 1). In a case that the diameters φ and height L of Cu column 1 are within the above-mentioned range, a shorted connection can be suppressed since the mounting can be performed with a pitch between the terminals being narrow, and simultaneously the downsized semiconductor package and the high integration thereof can be realized.

In addition, a solder plating layer, a Ni plating layer, a Fe plating layer, a Co plating layer, and an organic film layer containing imidazole compounds may be coated on an outermost surface of the Cu column 1, so that the arithmetic mean roughness of the outermost surface of Cu column 1 according to the present invention is equal to or less than 0.3 μm. When an outermost surface such that the arithmetic mean roughness is equal to or less than 0.3 μm is set on the Cu column 1 according to the present invention, fluidity of each Cu column 1 can be improved in setting the Cu columns in array on the substrate by a mounter and the like, and an adhesion between the Cu column 1 and the electrode on the substrate in the mounting can be improved. Simultaneously, since the Vickers hardness of the Cu column 1 itself is equal to or higher than 20 HV and equal to or less than 60 HV, an impact resistance to dropping can be improved after mounting the Cu column 1, and thereby the solution of problems in the present invention, where an appropriate space between the substrates is maintained, can be realized.

Moreover, in a case that a flux layer is coated on the outermost surface of the Cu core column or the Cu column 1 according to the present invention, because the flux layer has softness compared to a solder layer or a Ni plating layer, their fluidity is not much influenced. As for the adhesion between the Cu column 1 and the electrode in the mounting, the flux layer becomes deformed, when the flux layer is pressed to the electrode, and therefore, not the arithmetic mean roughness of the flux layer, but the arithmetic mean roughness of either the Cu column 1 or the Cu core column itself matters. Accordingly, when the arithmetic mean roughness of the Cu column 1 or the Cu core column, each of which is coated with the flux, is equal to or less than 0.3 μm, even when the arithmetic mean roughness of the Cu column 1 or the Cu core column, each of which is coated with the flux, exceeds 0.3 μm, the fluidity of each of the Cu columns 1 in setting them in array on the substrate does not worsen much. This allows an adhesion between each Cu column 1 and the electrode on the substrate in the mounting to be improved. Since the Vickers hardness of the Cu column 1 itself is equal to or higher than 20 HV and equal to or less than 60 HV, an impact resistance to dropping can be improved after mounting the Cu column 1, and thereby the solution of problems in the present invention, where an appropriate space between the substrates is maintained, can be realized.

Figure 2:
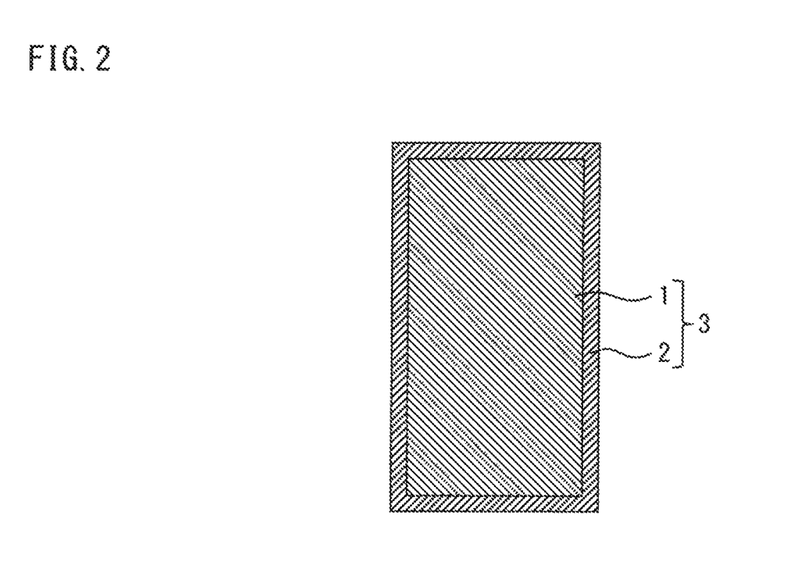
FIG. 2 is a diagram of a Cu core column according to the prevent invention for illustrating a configuration example thereof.

A Cu core column including a metal layer and the Cu column 1 can be configured, for example, by coating the surface of the Cu column 1 according to the present invention with the metal layer composed of a single metal or an alloy. As shown in FIG. 2, the Cu core column 3 is provided with the Cu column 1 and a solder layer 2 (metal layer) which coats the surface of the Cu column 1. In case of the alloy, a composition of the solder layer 2 is not specifically limited, if it is an alloy composition of the solder alloy whose main component is Sn. Additionally, the solder layer 2 may be a Sn plating film. For example, Sn, Sn—Ag alloy, Sn—Cu alloy, Sn—Ag—Cu alloy, Sn—In alloy and something to which a predetermined alloy element is added are exemplified. In any cases, a content of Sn is equal to or greater than 40 mass %. Moreover, if the alpha dose is not specified, Sn—Bi alloy or Sn—Pb alloy can be also used as the solder layer 2. The alloy element to be added is, for example, Ag, Cu, In, Ni, Co, Sb, Ge, P, Fe, etc. An alloy composition of the solder layer 2 is preferably Sn-3Ag-0.5 Cu alloy among them, in terms of a drop impact characteristic. A thickness of the solder layer 2 is not specifically limited: It is preferably equal to or less than 100 µm at each side thereof, which is sufficient. Generally, 20-50 µm at each side of the layer may be preferable.

Moreover, in the Cu core column, a Ni plating layer, a Fe plating layer, a Co plating layer or the like can be previously provided between the surface of the Cu column 1 and the solder layer 2. Thus, it is possible to reduce Cu diffusion into the solder in its jointing to the electrode. Accordingly, a thinning of copper of the Cu column 1 can be suppressed. The film thickness of the Ni plating layer, the Fe plating layer, the Co plating layer or the like is generally 0.1-20 µm at each side of the layer.

In addition, in the Cu core column mentioned above, the contents of respective U and Th in the solder layer 2 are equal to or less than 5 ppb in order to make the alpha dose of the Cu core column equal to or less than $0.0200$ cph/cm$^2$. Furthermore, from a viewpoint of the suppression of the soft error for the current or future high-density mounting, the contents of respective U and Th are equal to or less than 2 ppb.

The Cu core column according to the present invention may be configured to be the Cu column 1 and a plating layer (the metal layer) including at least one element selected from a group of Ni, Fe and Co which coats this Cu column 1. Furthermore, a solder layer may be coated on the surface of the plating layer constituting the Cu core column. As for the solder layer, the same kind as the above-mentioned solder layer can be adopted.

The Cu column 1 or the Cu core column 3 according to the present invention can be used for forming a solder joint connecting the electrodes. In this embodiment, for example, a structure in which the solder bump is mounted on the electrode of the printed circuit board is referred to as a solder joint. A solder bump is a structure in which the Cu column 1 is mounted on the electrode of the semiconductor chip.

In addition, the Cu column 1 or the Cu core column 3 according to the present invention can be also used for a through-silicon via (TSV) which connects electrodes between the vertically stacked semiconductors. TSV is manufactured: a hole is made in silicon by etching and an insulating layer is put into the hole and then, a Through Via Conductor is put on top of the insulating layer, and subsequently, both of the top and bottom surfaces of the silicon are ground so that the Through Via Conductor are exposed to the top and bottom surfaces of the silicon. In this process, a step of forming the Through Via Conductor in which Cu or the like is conventionally filled into the hole by a plating method is adopted. However, in this method, the whole surface of the silicon is dipped into plating solution, and therefore, there is a risk of adsorption of impurities, moisture or the like. Accordingly, the column according to the present invention is directly nailed into the hole formed in the silicon along the height direction, and it can be used as the Through Via Conductor. In a case of nailing the Cu column 1 into the silicon, it may be connected by a solder material such as solder paste and the like, and while in a case of nailing the Cu core column into the silicon, it can be connected by flux only. This allows any defect such as adsorption of impurities, moisture or the like to be prevented, and the manufacturing cost and manufacturing time can be also curtailed by omitting a plating step.

In addition, a flux layer may be coated on the outermost surface of the above-mentioned Cu column 1 or the Cu core column. The above-mentioned flux layer is composed of one kind or plural kinds of components containing a compound which works as an activator to prevent a surface of the Cu column 1 and a metal surface of the solder layer or the like from being oxidized as well as to remove a metal oxide film at the time of soldering. For example, the flux layer may be configured to be a plurality of components including a compound working as an activator, a compound working as an auxiliary activator and the like.

As an activator composing the flux layer, any one of an amine, an organic acid and a halogen compound, a combination of a plurality of amines, a combination of a plurality of organic acids, a combination of a plurality of halogen compounds, a combination of a single amine, a single organic acid and a single halogen compound or a combination of plural amines, organic acids and halogen compounds is added depending on the property required in the present invention.

As an auxiliary activator composing the flux layer, any one of an ester, an amide, an amino acid, a combination of a plurality of esters, a combination of a plurality of amides, a combination of a plurality of amino acids, a combination of a single ester, a single amide and a single amino acid or a combination of plural esters, amides and amino acids is added depending on the property of an activator.

In addition, the flux layer may contain rosin or resin, in order to protect compound and the like working as the activator from the heat at the time of reflow treatment. In addition, the flux layer may contain resin to bind compound and the like working as the activator to the solder layer.

The flux layer may be composed of a single layer containing a single compound or plural compounds. In addition, the flux layer may be composed of plural layers comprising plural compounds. The components composing the flux layer adhere to the surface of the solder layer in a solid state thereof, however, the flux needs to be liquefied or gasified in a step of binding the flux to the solder layer.

Therefore, the components composing the flux layer need to be solvent-soluble for the coating with solution. However, insoluble components exist in a solvent when a salt is formed, for example. The insoluble elements exist in liquid flux causes evenly adsorption thereof to be made difficult, in the flux containing low soluble components which cause forming depositions and the like. For this reason, the liquid flux cannot be composed by being mixed with a salt-forming compound in the prior art.

Whereas, in the Cu column 1 or the Cu core column having the flux layer according to the present invention, a flux multilayer may be formed by forming flux layers one by one and making them into a solid state thereof. Thus, even in a case that a salt-forming compound is used and the component cannot be mixed with the liquid flux, the flux layer can be formed.

By coating the surface of the Cu column 1 or the Cu core column, which is easy to become oxidized, with the flux layer working as the activator, it is possible to inhibit oxidation of the surface of the Cu column 1 and the surface of the solder layer or the metal layer of the Cu core column during storage.

Here, the color of flux is generally different from one of metal, and the color of the Cu column 1 and the like is also different from one of the flux layer. Therefore, an absorbed amount of the flux can be confirmed with color value such as lightness, yellowness and redness. In addition, a coloring matter can be added into the compound composing the flux layer for the purpose of coloring.

An organic film containing an imidazole compound may be coated on the above-mentioned Cu column 1. Thereby, by bonding an imidazole compound and a Cu layer on the outermost surface of the Cu column 1, an organic solderability preservative (OSP) film (imidazole copper complexes) is formed on the surface of the Cu column 1, and therefore, oxidation of the surface of the Cu column 1 can be inhibited.

The following will describe an example of a method of manufacturing the Cu column 1 according to this invention. A copper wire is prepared as a material, and then the prepared copper wire is drawn to extend by a die. After that, the copper wire is cut into a predetermined length by a cutting machine.

In this way, the Cu column 1 which is cylindrical-shaped with a predetermined diameter $\varphi$ and a predetermined length (height L) is manufactured. Moreover, the method of manufacturing the Cu column 1 is not limited to the present embodiments, and may adopt other known methods.

In this embodiment, an annealing treatment is performed on the manufactured Cu column 1 in order to obtain a Cu column 1 having low arithmetic average roughness and low Vickers hardness. In the annealing treatment, the Cu column 1 is heated at an annealing-available temperature of 700 degrees C for the predetermined time and then the heated Cu column 1 is slowly cooled in long hours. Accordingly, a recrystallization of the Cu column 1 is available and a moderate crystal growth can be expedited. Meanwhile, the extreme degradation of arithmetic average roughness of the Cu column 1 does not occur, since impurity elements contained in the Cu column 1 inhibit the excess growth of a crystal grain.

According to the present invention, since the Vickers hardness of the Cu column 1 is set to be equal to or higher than 20 HV and equal to or lower than 60 HV, it is possible to improve the impact resistance to dropping and simultaneously, it is possible to maintain an appropriate space between the substrates. Moreover, since the arithmetic mean roughness of Cu column 1 is equal to or less than 0.3 µm, the fluidity in setting the Cu columns 1 in array on the substrate can be improved as well as the adhesion between the Cu column 1 and the electrode in the mounting can be improved.

EXECUTED EXAMPLES

The following will describe executed examples of the invention, but the invention is not limited thereto. In the executed examples shown hereinafter, a plurality of Cu columns were manufactured with the use of a plurality of copper wire of different purity, and then the Vickers hardness, arithmetic mean roughness, and alpha dose of each of these manufactured Cu columns were measured.

<Manufacturing of Cu columns>

Copper wires having purity of 99.9%, 99.99%, and 99.995% were prepared.

Next, these copper wires were drawn to extend by a die, so that the diameter $\varphi$ of each of their top and bottom surfaces was 200 µm, and then each of the copper wires was cut at a position of the length of 200 µm (height L). Thereby, desired Cu columns were manufactured.

<Arithmetic Mean Roughness>

An evaluation (image evaluation) of the arithmetic mean roughness of the Cu columns was made by using a laser microscope (VK-9510/corresponding to JISB0601-1994) manufactured by KEYENCE Corporation. In the present executed references, a measurement was performed in a range of 10 square µm with setting the flattest part in the top surface of each of the Cu columns as a center of the square. A measurement pitch on the z-axis (height direction) of each of the Cu columns is 0.01 µm. The arithmetic mean roughness of each of the Cu columns was set as Ra under such conditions, and the arithmetic mean roughness Ra of any 10 parts was measured. Their arithmetic mean roughness was used as real arithmetic mean roughness.

In addition, a bottom surface or a peripheral surface of their Cu columns may be measured for the arithmetic mean roughness Ra, or the average value of measured values of the top and bottom surfaces, and the peripheral surface of Cu column may be used as a measured value. Moreover, although, in the above mentioned executed examples, ultrasound was utilized in order to flatten the surface of the Cu column, this invention is not limited thereto. For example, this could be realized by dissolving a surface of a Cu column slightly and dipping the Cu column into soluble liquid which expedites a flattening process. Acid solution such as sulfonic acid (methanesulfonic acid) based one, carboxylic acid (oxalic acid) based one can be used as liquid.

<Vickers Hardness>

The Vickers hardness of each of the Cu columns was measured in accordance with 'Vickers Hardness test—Test method JIS Z2244'. As equipment therefor, micro Vickers hardness testing machine, AKASHI micro hardness tester MVK-F 12001-Q manufactured by AKASHI Corporation was used.

<Alpha Dose>

A measurement method of the alpha dose will be as follows. An alpha-ray measurement instrument of a gas-flow proportional counter was used to measure the alpha dose. A measurement sample was a 300 mm×300 mm flat shallow container with the Cu columns being bedded on a bottom thereof so as not to see the bottom. This measurement sample was put in the alpha-ray measurement instrument and was remained in an atmosphere of PR-10 gas flow for 24 hours, and then the alpha dose was measured.

In addition, the PR-10 gas (argon 90% and methane 10%) used for the measurement was one that a gas bottle filled with the PR-10 gas was kept for a period equal to or longer than three weeks. A reason why using the gas bottle kept for the period equal to or longer than three weeks is based on JESD221 of JEDEC STANDARD—Alpha Radiation Measurement in Electronic Materials determined by JEDEC (Joint Electron Device Engineering Council) so as not to produce the alpha-ray by radon in the atmospheric air that enters into the gas bottle.

<Executed Example 1>

Figure 3:
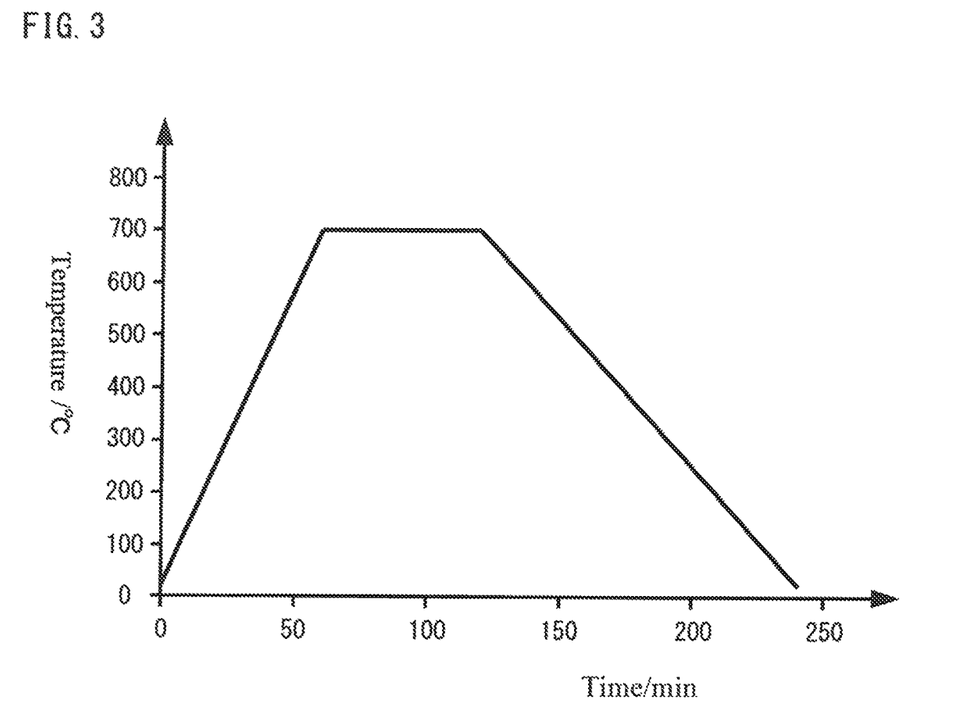
FIG. 3 is a diagram showing a relationship between temperature and time at the time of annealing.

The Cu columns manufactured with the use of a copper wire having the purity of 99.9% were put in a tray made of carbon and then the annealing treatment was performed thereon with putting the tray into a continuous conveyor type electrical resistance furnace. Annealing conditions for this case are shown in FIG. 3. In addition, nitrogen gas atmosphere was created in the furnace in order to prevent the oxidation of Cu column. The room temperature was set at 25 degrees C.

TABLE I

| status | start [min] | end [min] | Temperature (° C.) |
|---|---|---|---|
| start | 0 | 0 | 25 |
| rising temperature time | 0 | 60 | 700 |
| retention time | 60 | 120 | 700 |
| cooling time | 120 | 240 | 25 |

As the annealing conditions, as shown in FIG. 3 and Table 1, the time period for the temperature rising from a room temperature to 700 degrees C. was set at 60 minutes, the time period for the retention time at a temperature of 700 degrees C. was set at 60 minutes, and the time period for the cooling from 700 degrees C. to the room temperature was set at 120 minutes. Cooling the inside of the furnace was performed by the use of a cooling fan installed inside thereof. Subsequently, an acid treatment was performed by dipping the annealed Cu columns into dilute sulfuric acid. This is because an oxide film formed on the surface of each of the Cu columns by the annealing treatment is removed. The Vickers hardness, arithmetic mean roughness, and alpha dose of each of the Cu columns thus obtained at the annealing-treated case/not annealing-treated case will be shown in the Table 2 below.
<Executed Example 2>

In the executed example 2, the annealing treatment was performed on the Cu columns manufactured by a copper wire having the purity of 99.99% by the same method as the executed example 1, and the removal treatment of oxide film was conducted. And then the Vickers hardness, arithmetic mean roughness, and alpha dose of the obtained Cu columns were measured. These measurement results will be shown in the Table 2 below.

In the executed example 3, the annealing treatment was performed on the Cu columns manufactured by a copper wire having the purity of 99.995% by the same method as the executed example 1, and the removal treatment of oxide film was conducted. And then the Vickers hardness, arithmetic mean roughness, and alpha dose of the obtained Cu column were measured. These measurement results will be shown in the Table 2 below.

<Comparison Example 1>
In the comparison example 1, the Vickers hardness, arithmetic mean roughness, and alpha dose of the Cu columns manufactured by a copper wire having the purity of 99.9% were measured, respectively. These measurement results will be shown in the Table 2 below.
<Comparison Example 2>
In the comparison example 2, the Vickers hardness, arithmetic mean roughness, and alpha dose of the Cu columns manufactured by a copper wire having the purity of 99.99% were measured, respectively. These measurement results will be shown in the Table 2 below.
<Comparison Example 3>
In the comparison example 3, the Vickers hardness, arithmetic mean roughness, and alpha dose of the Cu columns manufactured by a copper wire having the purity of 99.995% were measured, respectively. These measurement results will be shown in the Table 2 below.
<Comparison Example 4>
In the comparison example 4, the Vickers hardness, arithmetic mean roughness, and alpha dose of the Cu columns manufactured by a copper wire having the purity exceeding 99.995% were measured, respectively. These measurement results will be shown in the Table 2 below.
<Comparison Example 5>
In the comparison example 5, the annealing treatment was performed on the Cu columns manufactured by a copper wire having the purity exceeding 99.995% by using the same method as the executed example 1, and the removal treatment of oxide film was conducted. And then the Vickers hardness, arithmetic mean roughness, and alpha dose of the obtained Cu columns were measured. These measurement results will be shown in the Table 2 below.

TABLE 2

| | PURITY | VICKERS HARD-NESS (HV) | ARITH-METIC MEAN ROUGH-NESS (μ m) | α DOSE (cph/cm$^2$) | REMARKS |
|---|---|---|---|---|---|
| EXECUTED EXAMPLE 1 | 99.90% | 57.1 | 0.10 | <0.0010 | Annealing-treated |
| EXECUTED EXAMPLE 2 | 99.99% | 52.9 | 0.17 | <0.0010 | Annealing-treated |
| EXECUTED EXAMPLE 3 | 99.995% | 50.2 | 0.28 | <0.0010 | Annealing-treated |
| COMPARISON EXAMPLE 1 | 99.90% | 125.3 | 0.15 | <0.0010 | Not Annealing-treated |
| COMPARISON EXAMPLE 2 | 99.99% | 110.7 | 0.14 | <0.0010 | Not Annealing-treated |
| COMPARISON EXAMPLE 3 | 99.995% | 108.0 | 0.17 | <0.0010 | Not Annealing-treated |
| COMPARISON EXAMPLE 4 | exceeding 99.995% | 103.6 | 0.21 | <0.0010 | Not Annealing-treated |
| COMPARISON EXAMPLE 5 | exceeding 99.995% | 49.8 | 1.42 | <0.0010 | Annealing-treated |

As shown in the Table 2, the arithmetic mean roughness of the Cu column was 0.10 μm in the executed example 1. The arithmetic mean roughness of the Cu column was 0.17 μm in the executed example 2. The arithmetic mean roughness of the Cu column was 0.28 μm in the executed example 3. Thus, the arithmetic mean roughness of the Cu column was equal to or less than 0.3 μm in each executed example. In addition, the Vickers hardness of the Cu column was 57.1 in the executed example 1. The Vickers hardness of the Cu column was 52.9 in the executed example 2. The Vickers hardness of the Cu column was 50.2 in the executed example 3. Thus, the Vickers hardness of the Cu column was equal to or higher than 20 HV and equal to or less than 60 HV in each executed example. Consequently, it has been confirmed that the Cu columns which have both physical properties of low Vickers hardness and low arithmetic mean roughness are obtained by performing the annealing treatment on the Cu columns at the time of manufacturing.

Whereas, in the comparison examples 1 through 4 where the annealing treatment was not performed on the Cu column, the arithmetic mean roughness of each of the Cu columns was equal to or less than 0.3 µm, but the Vickers hardness exceeded 60 HV. Therefore, it has been confirmed that they do not meet the requirement that the Vickers hardness is equal to or higher than 20 HV and equal to or less than 60 HV. In addition, in the comparison example 5, the Vickers hardness of the Cu column was ranged of equal to or higher than 20 HV and equal to or less than 60 HV, but the arithmetic mean roughness exceeded 0.3 µm. Accordingly, it has been confirmed that the Cu column in case of using a Cu column having a high purity does not meet the requirement that the arithmetic mean roughness is equal to or less than 0.3 µm, even if the annealing treatment is performed on the Cu column at the time of manufacturing.

Additionally, in the executed examples 1 through 3, the alpha dose of each of the Cu columns was less than 0.0010 cph/cm$^2$. It has been confirmed that their results meet the requirement of <0.0200 cph/cm$^2$, and further, meet the requirement of <0.0010 cph/cm$^2$.

Next, the Cu core column was manufactured by coating a solder plating layer of Sn-3Ag-0.5 Cu alloy on the surface of the Cu column after the annealing treatment in the executed example 1 mentioned above. And then, this Cu core column and the plating solution used at the time of manufacturing the Cu core column were put into a 300 cc beaker as they were and an ultrasonic generator irradiated ultrasonic waves on it for 60 minutes. As for the ultrasonic generator, a commercially available ultrasonic cleaner (US-CLEANER manufactured by AS ONE Corporation) was used to irradiate them with output of 80W and frequency of 40 kHz. After 60 minutes elapsed, the Cu core column was washed by ion exchange water and then dried by hot air. An arithmetic mean roughness and alpha dose of the manufactured Cu core column were measured, respectively. The arithmetic mean roughness of the Cu core column was equal to or less than 0.3 µm, which was similar to the executed examples 1 through 3. Moreover, as for a Cu core column in which a Ni plating layer was coated on the surface of the Cu column in the executed example 1, and a Cu core column in which a Ni plating layer and a solder plating layer were sequentially coated on the surface of the Cu column in the executed example 1, an ultrasonic treatment was conducted under the same condition as mentioned above, and an arithmetic mean roughness and alpha dose were measured, respectively. Consequently, the arithmetic mean roughness of each of these Cu core columns was equal to or less than 0.3 µm, which was similar to the executed examples 1 through 3. Additionally, in any case, the alpha dose was less than 0.0010 cph/cm$^2$. It has been confirmed that the results meet the requirement of <0.0200 cph/cm$^2$, and further, meet the requirement of <0.0010 cph/cm$^2$.

Furthermore, even in cases of coating either Fe plaiting layer or Co plaiting layer, in lieu of the Ni plating layer mentioned above, the arithmetic mean roughness was equal to or less than 0.3 µm, which was similar to the Cu core column coated with Ni plating layer. Additionally, the alpha dose was also less than 0.0010 cph/cm$^2$. It has been confirmed that the result meets the requirement of <0.0200 cph/cm$^2$, and further, meets the requirement of <0.0010 cph/cm$^2$.

Next, a flux-coated Cu column was manufactured by coating flux on the surface of the Cu column after the annealing treatment mentioned above in the executed example 1, and then an arithmetic mean roughness and alpha dose of the manufactured flux-coated Cu column were measured, respectively. The arithmetic mean roughness of the flux-coated Cu column was equal to or less than 0.3 µm, which was similar to the executed examples 1 through 3. Furthermore, in the flux-coated Cu column, the alpha dose was less than 0.0010 cph/cm$^2$. It has been confirmed that the result meets the requirement of <0.0200 cph/cm$^2$, and further, meets the requirement of <0.0010 cph/cm$^2$.

In addition, as for a flux-coated Cu core column in which flux was coated on the surface of the Cu core column mentioned above, the arithmetic mean roughness was equal to or less than 0.3 µm, which was similar to the flux-coated Cu column. Furthermore, in the flux-coated Cu core column, the alpha dose was less than 0.0010 cph/cm$^2$. It has been confirmed that the result meets the requirement of <0.0200 cph/cm$^2$, and further, meets the requirement of <0.0010 cph/cm$^2$.

Apart from the above, an OSP-treated Cu column was manufactured by coating an organic film containing an imidazole compound on the surface of the annealing treated Cu column of the executed example 1, and then an arithmetic mean roughness and alpha dose of the manufactured OSP-treated Cu column were measured, respectively. It was confirmed that the arithmetic mean roughness of the OSP-treated Cu column was equal to or less than 0.3 µm and the alpha dose was equal to or less than 0.0010 cph/cm$^2$, which were similar to the executed examples 1 through 3.

In addition, although the columns in this invention have been exemplified as a cylinder column in each of the executed examples and the comparison examples, a form of column is not limited to the cylinder column. Any column such as triangular prism, quadrangular prism or the like, which has each of the top and bottom surfaces that contacts directly a substrate and is composed of 3 sides or more, allows the effect of the present invention to be produced.

The invention claimed is:

1. A Cu column containing:
    a top surface, a bottom surface, and a cylindrical peripheral surface extending between the top surface and the bottom surface,
    purity which is equal to or higher than 99.9% and equal to or lower than 99.995%,
    arithmetic mean roughness which is equal to or less than 0.3 µm, and
    Vickers hardness which is equal to or higher than 20 HV and equal to or less than 60 HV,
    wherein a diameter of the top surface is 1-300 µm, a diameter of the bottom surface is 1-300 µm, and a height of the cylindrical peripheral surface is 1-3000 µm, and
    wherein the arithmetic mean roughness is equal to or less than 0.3 µm across the cylindrical peripheral surface of said Cu column.

2. The Cu column according to claim 1, wherein an alpha dose is equal to or less than 0.0200 cph/cm$^2$.

3. The Cu column according to claim 1, wherein the Cu column is coated with a flux layer.

4. The Cu column according to claim 1, wherein the Cu column is coated with an organic film containing an imidazole compound.

5. A Cu core column, containing:
    the Cu column according to claim 1; and
    a solder layer which coats the Cu column.

6. A Cu core column containing:
    the Cu column according to claim 1; and a plating layer which includes at least one element selected from a group of Ni, Fe and Co, the plating layer coating the Cu column.

7. The Cu core column according to claim 6, further comprising:
a solder layer which coats the plating layer.

8. The Cu core column according to claim 5, wherein an alpha dose is equal to or less than 0.0200 cph/cm².

9. The Cu core column according to claim 5, wherein the Cu core column is coated with a flux layer.

10. A solder joint using the Cu column according to claim 1.

11. A through-silicon via using the Cu column according to claim 1.

12. A solder joint using the Cu core column according to claim 5.

13. A through-silicon via using the Cu core column according to claim 5.

14. The Cu column according to claim 2, wherein the Cu column is coated with a flux layer.

15. The Cu column according to claim 2, wherein the Cu column is coated with an organic film containing an imidazole compound.

16. A Cu core column, containing:
the Cu column according to claim 2; and
a solder layer which coats the Cu column.

17. The Cu column according to claim 1, wherein said diameter of the top surface is 1-200 μm and said diameter of the bottom surface of 1-200 μm.

18. The Cu column according to claim 1, wherein said diameter of the top surface is 1-100 μm, said diameter of the bottom surface is 1-100 μm, and said height is 1-100 μm.

19. The Cu column according to claim 1, wherein the arithmetic mean roughness is equal to or less than 0.2 μm across the entire outermost surface of said Cu column.

* * * * *